United States Patent
Kobayashi et al.

(10) Patent No.: US 7,539,328 B2
(45) Date of Patent: May 26, 2009

(54) SURFACE POSITION MEASURING METHOD AND APPARATUS

(75) Inventors: Takenobu Kobayashi, Utsunomiya (JP); Yuji Kosugi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 984 days.

(21) Appl. No.: 10/777,192

(22) Filed: Feb. 13, 2004

(65) Prior Publication Data

US 2005/0169515 A1    Aug. 4, 2005

(30) Foreign Application Priority Data

Feb. 13, 2003    (JP)    ............. 2003-035170

(51) Int. Cl.
 G06K 9/00    (2006.01)
 G01C 1/00    (2006.01)
 G01B 11/00    (2006.01)
(52) U.S. Cl. .................. 382/106; 382/145; 356/152.2; 356/398
(58) Field of Classification Search .......... 382/145, 382/147, 151, 100, 106; 356/398–401, 152.2
See application file for complete search history.

(56) References Cited

U.S. PATENT DOCUMENTS

| | | | | |
|---|---|---|---|---|
| 4,147,936 A | * | 4/1979 | Eickel | 378/22 |
| 4,689,491 A | * | 8/1987 | Lindow et al. | 250/559.07 |
| 5,189,494 A | * | 2/1993 | Muraki | 356/401 |
| 5,477,304 A | * | 12/1995 | Nishi | 355/53 |
| 5,640,243 A | * | 6/1997 | Koitabashi et al. | 356/401 |
| 5,751,428 A | * | 5/1998 | Kataoka et al. | 356/401 |
| 5,793,471 A | * | 8/1998 | Kanda et al. | 355/53 |
| 5,825,456 A | * | 10/1998 | Tabata et al. | 351/201 |
| 5,834,767 A | * | 11/1998 | Hasegawa et al. | 250/237 G |
| 5,883,701 A | * | 3/1999 | Hasegawa et al. | 355/53 |
| 5,892,573 A | * | 4/1999 | Takahashi et al. | 355/61 |
| 5,898,477 A | * | 4/1999 | Yoshimura et al. | 355/53 |

(Continued)

FOREIGN PATENT DOCUMENTS

JP    3-157822    7/1991

(Continued)

*Primary Examiner*—Matthew C Bella
*Assistant Examiner*—Manav Seth
(74) *Attorney, Agent, or Firm*—Fitzpatrick, Cella, Harper & Scinto

(57) ABSTRACT

A method of measuring a position of a surface of an object while the object is scanned relative to a detection unit in a scanning direction in an X-Y plane. The detection unit is configured to detect the position of the surface in a Z direction perpendicular to the X-Y plane. The method includes a detecting step of scanning the object relative to the detection unit in two scanning directions opposite to each other, and detecting, with respect to each of the two scanning directions, a position of the surface for the same detection point on the surface, a calculating step of calculating a correction value for correcting a position of the surface position to be detected by the detection unit, based on the positions of the surface detected with respect to the two scanning directions in the detecting step, and a correcting step of correcting the position of the surface detected by the detection unit while the object is scanned relative to the detection unit in one of the two scanning directions, with the correction value obtained in the calculating step.

5 Claims, 9 Drawing Sheets

U.S. PATENT DOCUMENTS

| | | | |
|---|---|---|---|
| 5,920,398 A * | 7/1999 | Iwanaga et al. | 356/401 |
| 5,929,977 A * | 7/1999 | Ozawa | 355/53 |
| 6,023,320 A * | 2/2000 | Kawashima | 355/53 |
| 6,068,954 A * | 5/2000 | David | 430/22 |
| 6,081,614 A * | 6/2000 | Yamada et al. | 382/151 |
| 6,130,751 A * | 10/2000 | Haginiwa et al. | 356/401 |
| 6,426,508 B1 * | 7/2002 | Kosugi et al. | 250/548 |
| 6,608,681 B2 * | 8/2003 | Tanaka et al. | 356/400 |
| 6,678,038 B2 * | 1/2004 | Binnard | 355/72 |
| 7,006,235 B2 * | 2/2006 | Levy et al. | 356/600 |
| 2002/0054715 A1 * | 5/2002 | Os et al. | 382/276 |
| 2003/0160195 A1 | 8/2003 | Kosugi | 250/559.29 |

FOREIGN PATENT DOCUMENTS

| | | |
|---|---|---|
| JP | 9-45608 | 2/1997 |
| JP | 2910327 | 4/1999 |

* cited by examiner

SURFACE POSITION MEASURING METHOD AND APPARATUS

This application claims priority from Japanese Patent Application No. 2003-035170, filed on Feb. 13, 2003, which is hereby incorporated by reference herein.

FIELD OF THE INVENTION AND RELATED ART

This invention relates to surface position detecting technology for detecting a position of a surface of an object, particularly, for use in an exposure apparatus of a slit scan type (scanning exposure method).

The size of circuit patterns has been reduced to meet enlargement of integration of VLSI, and projection lens systems currently used in projection exposure apparatuses have an enlarged numerical aperture (NA). Also, the allowable depth of focus of lens systems used in a transfer process of the circuit pattern has been narrowed. Thus, in order to ensure superior pattern transfer, a process region (shot) to be exposed of a wafer as a whole should be exactly positioned within the depth of focus of the projection lens system.

In slit-scan type exposure apparatuses, in order to assure good pattern transfer over the whole process region to be exposed, the position and tilt of the wafer surface (subject to be exposed) is detected precisely during scan motion. During the scan exposure, corrective drive of auto-focusing and auto-leveling is carried out continuously to thereby successively bring the wafer surface into registration with a best imaging plane of the projection optical system.

Surface position detecting mechanisms therefor include one in which a light beam is projected onto a wafer surface in an oblique direction and reflection light from the wafer surface is detected as a positional deviation upon a sensor, and one in which a gap sensor, such as an air microsensor or electrostatic capacitance sensor, is used. Anyway, in these types, during the scan, from a plurality of level measured values, a corrective driving amount for the level and tilt of the wafer surface, when the same passes through the exposure slit region, is calculated.

Further, in the detecting mechanism described above, in order to assure that a process region (shot) of a wafer as a whole is exactly positioned within the allowable depth of focus of a reduction projection lens system, having been narrowed with the enlargement of the NA, detection points are set at plural locations inside each shot region of the wafer, and differences between detected values and a best focus setting plane are stored as measurement offset and are controlled exactly, this being made to avoid erroneous detection of a wafer surface (focus setting plane) due to the influence of any local pattern step (topography) under a detection point (or reflection point).

FIG. 4 schematically illustrates an alternating scan for process regions on a wafer. In this example, there are six sample shots with respect to each of which pre-scanning in up and down directions are carried out, whereby a corrective drive amount toward a best imaging position is calculated.

With decreasing size of circuit patterns, the NA of reduction projection systems has been enlarged and, on the other hand, the allowable depth of focus in a transfer process of the circuit pattern has been narrowed. Currently, in exposure apparatuses used for a rough pattern process, the allowable depth of focus is 1 μm or more, such that a measurement error included in measured values obtained successively during the scan exposure or influences of a surface step (difference in level) within the chip can be disregarded. However, in order to meet 1 GDRAM, the depth will be not greater than 0.3 μm. Thus, a measurement error included in the measured values or the influence of a surface step in the chip will not be disregarded.

Thus, when the focus of the wafer surface (level and tilt) is measured, and then focusing is carried out to hold the wafer surface within the allowable depth, since the wafer surface has surface irregularities, in order to assure that the entirety of the chip or shot is registered with the imaging plane, it is necessary to perform offset correction, while exactly reflecting offsets memorized beforehand. Otherwise, the allowable depth cannot be held. In this case, accurate offset correction is unattainable, unless the focus measurement point during exposure of each shot is exactly registered with the offset measurement point.

In the slit scan exposure method, the time for moving back the reticle stage is useless. Therefore, generally, alternate scan is adopted, taking into account the throughput. However, in a conventional surface position detecting method, no particular attention has been paid to the fact that the measurement position (region of the subject of measurement) shifts between the up and down scan directions, and a focus correction amount toward the best imaging plane position is calculated and controlled, while taking the central position of the shot, for example, as a reference (offset reference surface). If, therefore, the wafer surface position corresponding to the measurement point taken as a reference differs with the scan direction, as shown in portions (i) and (ii) in FIG. 6, there would occur a difference in the focus correcting amount toward the best imaging plane position, between the up and down directions, as shown in a portion (iii) of FIG. 6. An undesirable defocus will be produced due to this difference with the direction.

Factors for such positional deviation may be as follows. A wafer stage control system drives a wafer with a control cycle of the wafer stage control system, on the basis of the stage position, as measured at predetermined sampling intervals. If the control cycle of the wafer stage control system is $T_s$ and the moving speed of the wafer stage is $V_s$, the measurement position will be dispersed by $T_s \times V_s$, at the largest. This is called "jitter". FIG. 5 illustrates an example of it. At the start position of a shot, the sample clock is reset. After synchronism with the start position is taken, scan in a direction of an arrow is initiated. When each measurement point is detected at the trailing edge of the clock, there is a positional deviation produced so that a point 502 is detected, despite that a point 501 should be detected.

Such jitter is changeable with the stage speed. Particularly, the stage speed is recently increasing for improvement of the throughput. Therefore, the influence of a deviation of measurement position resulting from jitter upon the focus precision cannot be disregarded. Such inconveniences might be solved by using high-speed control hardware to shorten the control intervals, thereby to reduce the jitter close to zero, in order to decrease the difference between the up and down scan directions. With this method, however, not only will the cost rise, but also, the structure is exclusively arranged for the difference between scan directions, such that the whole system lacks a good balance.

SUMMARY OF THE INVENTION

It is accordingly an object of the present invention to provide a surface position detecting technology by which the position of a surface of an object can be detected very precisely.

In accordance with an aspect of the present invention, there is provided a method of measuring a position of a surface of an object while relatively scanning the object and a detection unit, the method comprising a first measuring step for relatively scanning the detecting unit and a first object in a plurality of directions and for measuring, with respect to each of the plurality of directions, a surface position of the first object, a calculating step for calculating a correction amount for correcting a surface position to be provided by the detecting unit, on the basis of the surface positions obtained with respect to the plurality of directions in the first measuring step, a second measuring step for measuring a surface position of a second object, while relatively scanning the detecting unit and the second object in any one of the plurality of directions, and a correcting step for correcting the surface position of the second object obtained by the second measuring step, on the basis of the correction amount obtained by the calculating step.

In accordance with another aspect of the present invention, there is provided a measuring system for measuring a position of a surface of an object, comprising a detecting unit for detecting the position of the surface of the object, a scanning unit for relatively scanning the object and said detecting unit, a calculating unit for calculating, on the basis of surface positions of a first object obtained by relatively scanning the first object and the detecting unit in a plurality of directions, a correction unit for correcting a surface position to be provided by the detecting unit, and a correcting unit for correcting a surface position of a second object obtained by relatively scanning the second object and the detecting unit in any one of the plurality of directions, on the basis of the correction amount obtained by the calculating unit.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

First Embodiment

Figure 1:
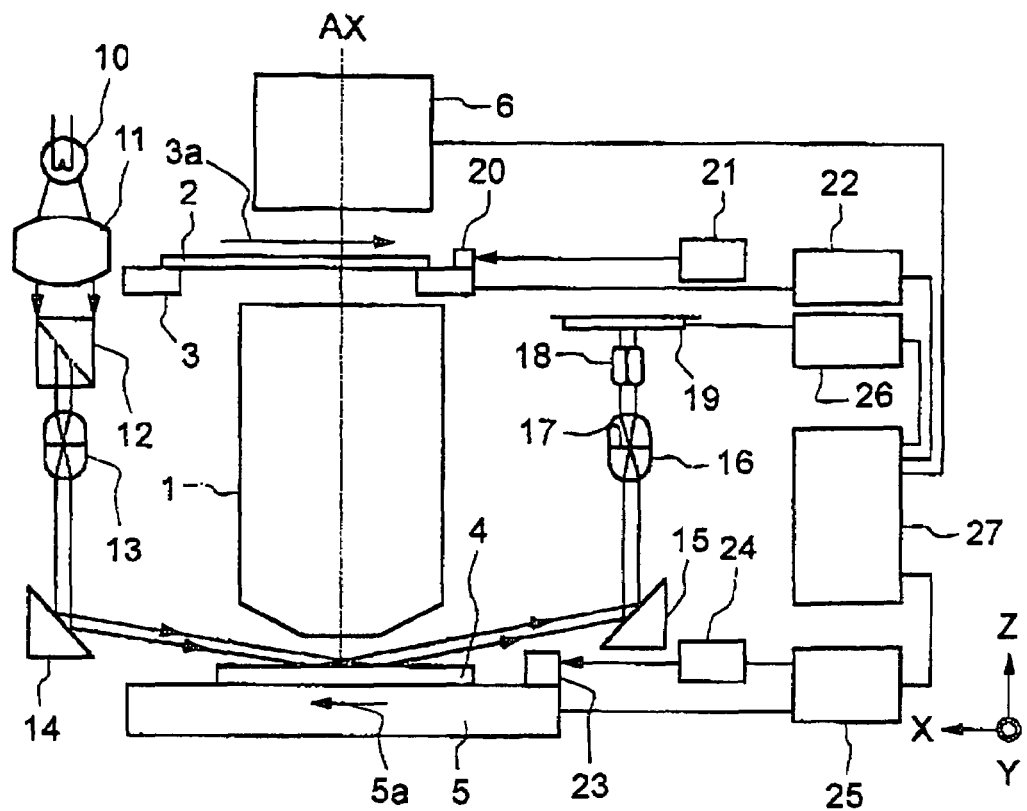
FIG. 1 is a schematic view of a main portion of a projection exposure apparatus of a slit scan type that uses a surface position detecting method according to an embodiment of the present invention.

FIG. 1 is a schematic view of a main portion of a projection exposure apparatus of a slit scan type that uses a surface position detecting method according to an embodiment of the present invention.

In FIG. 1, denoted at 1 is a reduction projection lens having an optical axis AX. The image plane there is perpendicular to the Z direction. Reticle 2 is held on a reticle stage 3, and a pattern of the reticle 2 is projected by a reduction projection lens 1 in a reduced scale, whereby an image is formed on its focal plane. Denoted at 4 is a wafer having a surface coated with a resist. There are a large number of process regions (shots) to be exposed, arrayed on the wafer, and these regions have the same pattern structure formed through a preceding exposure process or processes. Denoted at 5 is a wafer stage with an X-Y bar mirror 23 for attracting and fixedly holding the wafer 4. The wafer stage 5 comprises an X stage being movable horizontally in the X-axis and Y-axis directions, a leveling stage being movable in the Z-axis direction and rotatable about the X and Y axes, respectively, and a rotational stage being rotatable about the Z axis. The X, Y and Z axes are orthogonal to each other.

Denoted at 10-19 are components of a detection optical system for detecting a surface position and tilt of the wafer 4. Denoted at 10 is a light source, which comprises a white lamp or an illumination unit arranged to project light of a high-luminance light-emitting diode having plural and different peak wavelengths. Denoted at 11 is a collimator lens that receives light from the light source 10 and outputs parallel light having an approximately uniform sectional intensity distribution. Denoted at 12 is a slit member of a prism-like shape, for producing slit-like light to be projected on the wafer 4. It comprises a pair of prisms being cemented to each other with their slant surfaces opposed to each other. At the cemented surface, there are a plurality of openings (for example, six pinholes) defined there by use of a light blocking film, such as chromium, for example. Denoted at 13 is an optical system of a bi-telecentric system, and it functions to direct six independent light beams passed through the pinholes of the slit member 12 toward six measurement points on the wafer 4 surface via a mirror 14. Although only two light beams are illustrated in FIG. 1, in this embodiment, there are light beams of three, being accumulated into one as seen, in the direction perpendicular to the sheet of the drawing, such that light beams of a total of six are there. Here, with respect to the lens system 13, the slant surface of the prism where the pinholes are formed, and a plane that contains the wafer 4 surface, are set to satisfy a Scheinmpflug's condition.

Figure 2:
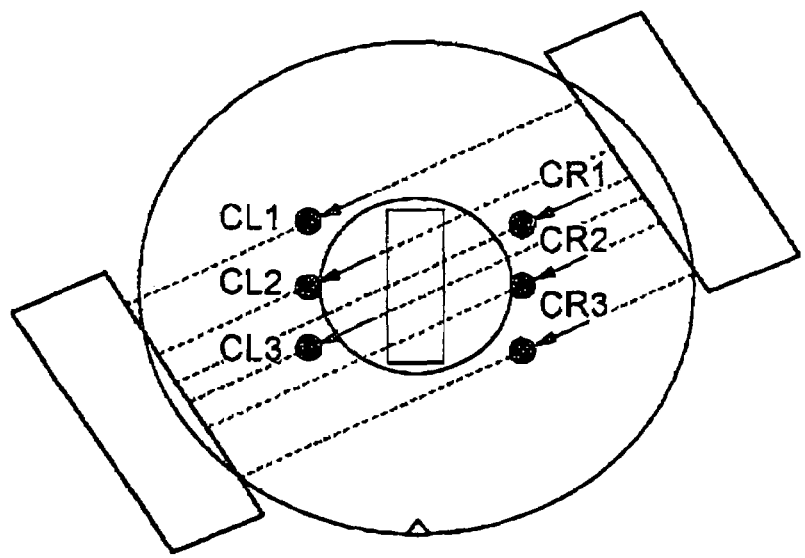
FIG. 2 is a schematic view for explaining a positional relationship of an exposure slit and measurement points, in the surface position detection using a detection optical system.
Figure 3:
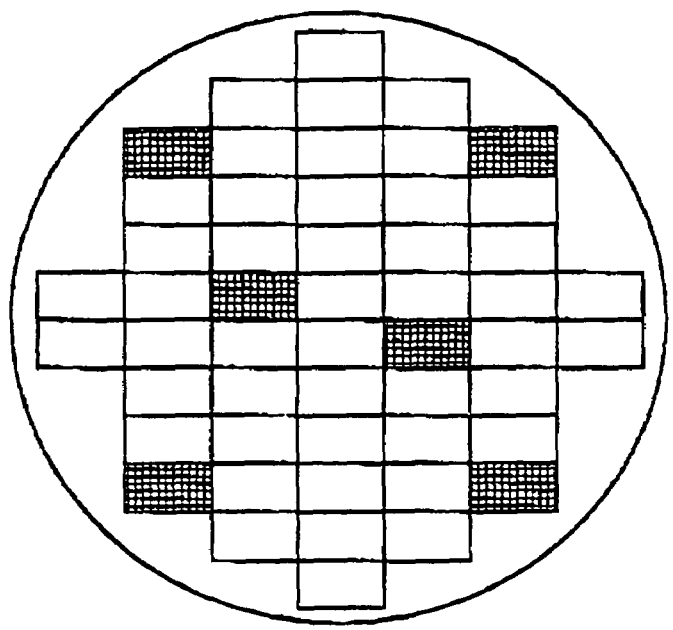
FIG. 3 is a plan view for explaining an example of the layout of process regions to be exposed, on a wafer, and selection of sample shots for pre-scanning in the present invention.
Figure 4:
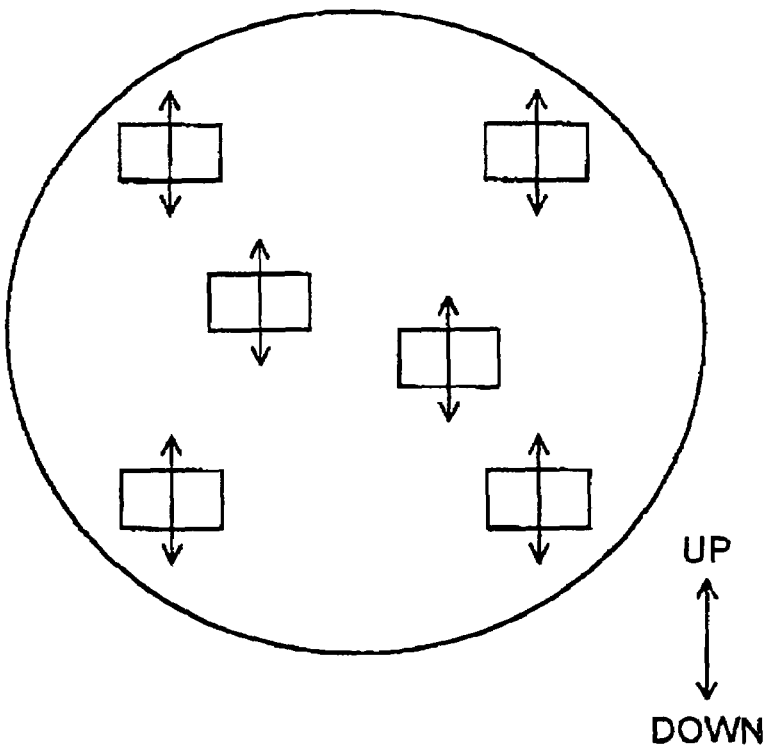
FIG. 4 is a schematic view for explaining an alternate scan of sample shots of a process region to be exposed, on a wafer.
Figure 5:
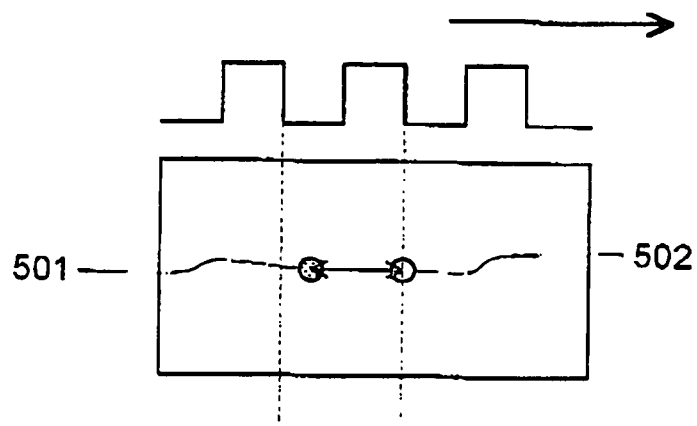
FIG. 5 is a schematic view for explaining a positional deviation of the measurement point, in a process region to be exposed of a wafer.

In this embodiment, the incidence angle of each light beam from the light projecting means 10-14 upon the wafer surface (i.e., the angle defined by a normal to the wafer surface, that is, the optical axis) is Φ=70 degrees or more. On the wafer 4 surface, there are a number of regions (shots) having the same pattern structure formed through the preceding exposure process or processes, as shown in FIG. 3. The six light beams passed through the lens system 13 are incident on and imaged at respective measurement points CL1, CL2, CL3, CR1, CR2 and CR3 (as shown in FIG. 2), in the pattern region, which measurement points are independent from each other. Further, in order to assure that these six measurement points are observed on the wafer 4 surface independently of each other, the light beams are projected thereon in a direction rotated by θ (e.g. 22.5 degrees) from the X direction (scan direction) and in the X-Y plane. This is discussed in Japanese Patent No. 2910327 (Japanese Patent Application No. H3-157822) and, with this structure, the spatial disposition of the components is made appropriately, and high-precision detection of surface positional information is facilitated.

Next, structures of detection side components 15-19 for detecting reflection light from the wafer 4 will be explained. The six light beams from the wafer 4 are reflected by the mirror 15, and they are directed to a light receiving optical system 16, which is a bi-telecentric system. Inside the light receiving optical system 16, there is a stopper 17, which is provided commonly in relation to the six measurement points, and it functions to intercept higher-order diffraction light (noise) to be produced by a circuit pattern that is present on the wafer 4. The light beams passed through the light receiving optical system 16 have their optical axes placed in parallel to each other, and they are re-imaged upon detection surfaces of a photoelectric converting means group 19, respectively, by means of six separate correcting lenses of a correcting optical system group 18, in the form of light spots having the same size. The photoelectric converting means group 19 comprises six one-dimensional CCD line sensors corresponding to the six measurement points. The optical system having elements of 16-18 is tilt-corrected so that the measurement points on the wafer 4 surface and the detection surfaces of the photoelectric converting means group 19 are placed in a conjugate relation with each other. Therefore, any local tilt at each measurement point would not cause a change in the position of a pinhole image on the detection surface. Thus, it is assured that the position of the pinhole image upon the detection surface changes in response to a change in level (height) of a corresponding measurement point in the Z direction.

Next, a slit-scan type exposure system will be described. As shown in FIG. 1, the reticle 2 is attracted to and held fixed by the reticle stage 3. After this, it is scanningly moved along a plane perpendicular to the optical axis AX of the projection lens 1, and in a direction of an arrow 3a (X-axis direction), at a constant speed. Also, as regards a direction orthogonal to the arrow 3a (i.e., Y-axis direction), corrective drive is made to perform the scan, while continuously keeping the target coordinate position in that direction. Positional information regarding the reticle stage 3 with respect to the X and Y directions is continuously measured by projecting a plurality of laser beams from a reticle stage interferometer system 21 toward an X-Y bar mirror 20 fixed to the reticle stage.

The exposure illumination optical system 6 uses a light source that produces pulse light, such as an excimer laser, for example, and it comprises a beam shaping optical system, an optical integrator, a collimator, a mirror, and so on, not shown in the drawing. The illumination optical system 6 is made of a material that can efficiently transmit or reflect pulse light in the deep ultraviolet region. The beam shaping optical system serves to change the sectional shape (including size) of the incident beam to a desired shape. The optical integrator functions to make uniform the distribution characteristic of light to ensure that the reticle 2 is illuminated with a uniform illuminance. A masking blade (not shown) is provided inside the exposure illumination optical system 6, and it functions to set a rectangular illumination region corresponding to the chip size. The pattern of the reticle 2 as thus partially illuminated with such an illumination region is projected through the projection lens 1 onto the wafer 4 being coated with a resist.

A main controller 27 serves to control the whole system in accordance with a scan, so that an image of a portion of the rectangular region of the reticle 2, being illuminated, is formed on a predetermined region of the wafer 4. As regards the wafer 4, control is performed in relation to the position in X-Y plane, that is, X-Y coordinates, rotation θ about an axis parallel to the Z axis, the position in the Z direction, that is, the Z coordinates, and rotations α and β about axes parallel to the X and Y axes.

Alignment between the reticle 2 and the wafer 4 with respect to the X-Y plane is accomplished by calculating control data on the basis of positional data of the reticle stage interferometer 21 and the wafer stage interferometer 24, and wafer position data obtainable through an alignment microscope (not shown), and by controlling a reticle position control system 22 and a wafer stage control system 25.

When the reticle stage 3 is to be scanned in the direction of an arrow 3a, the wafer stage 5 is scanned in a direction of an arrow 5a and at a speed corrected by an amount corresponding to the reduction magnification of the projection lens 1. The scan speed of the reticle stage 3 is determined on the basis of the width, in the scan direction, of a masking blade (not shown) of the exposure illumination optical system 6 and the sensitivity of the resist applied to the wafer 4 surface, in favor of the throughput.

The alignment in the Z-axis direction with respect to the image of the pattern on the reticle 2, that is, the alignment with reference to the image plane, is accomplished by controlling a leveling stage in the wafer stage 5 through the wafer position control system 25, on the basis of the result of a calculation made by a surface position detecting system 26, which detects level data of the wafer 4. More specifically, from the level data of wafer level measuring spot lights at three points disposed adjacent to the slit with respect to the scan direction, tilt in a direction perpendicular to the scan direction (i.e., tilt about the X axis), as well as the level (height) in the optical axis AX direction, are calculated to determine a correction amount toward the best image plane position, at the exposure position. Correction is performed on the basis of this.

In order to detect the position of the process region, to be exposed, of the wafer 4 in the Z direction, that is, the position (Z) with respect to the image plane position, as well as a deviation of tilt (α, β), it is very important to measure the wafer 4 surface very accurately. When an optical method detection system is used for this purpose, there occurs a detection error due to a pattern step difference (topography). However, a pre-scan may be performed prior to the exposure, and a condition with which the focus value can be measured at a highest precision may be measured. Also, offset control may be made with reference to the height (level) of such a portion of the process region of the wafer where a highest focus precision is required. By doing so, an error of focus measured values obtained during the scan exposure can be corrected in real time. This is discussed in Japanese Laid-Open Patent Application No. H9-045608.

Figure 7:
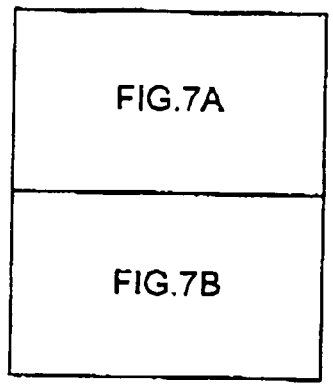
FIG. 7, including
Figure 7A:
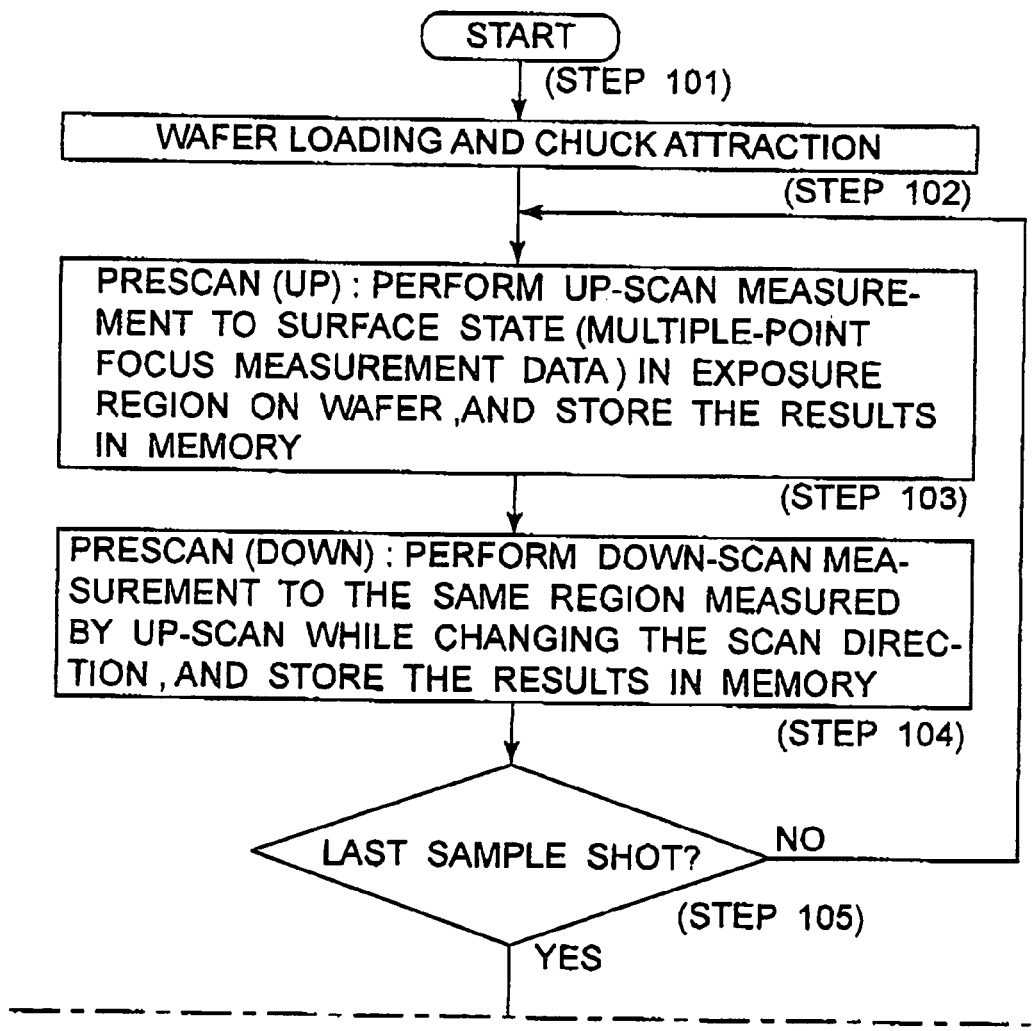
FIGS. 7A and 7B, is a flow chart for explaining an example of offset measurement with the surface position detecting method of the present invention, as well as a sequence for surface position corrective drive during exposure of the shots.
Figure 7B:
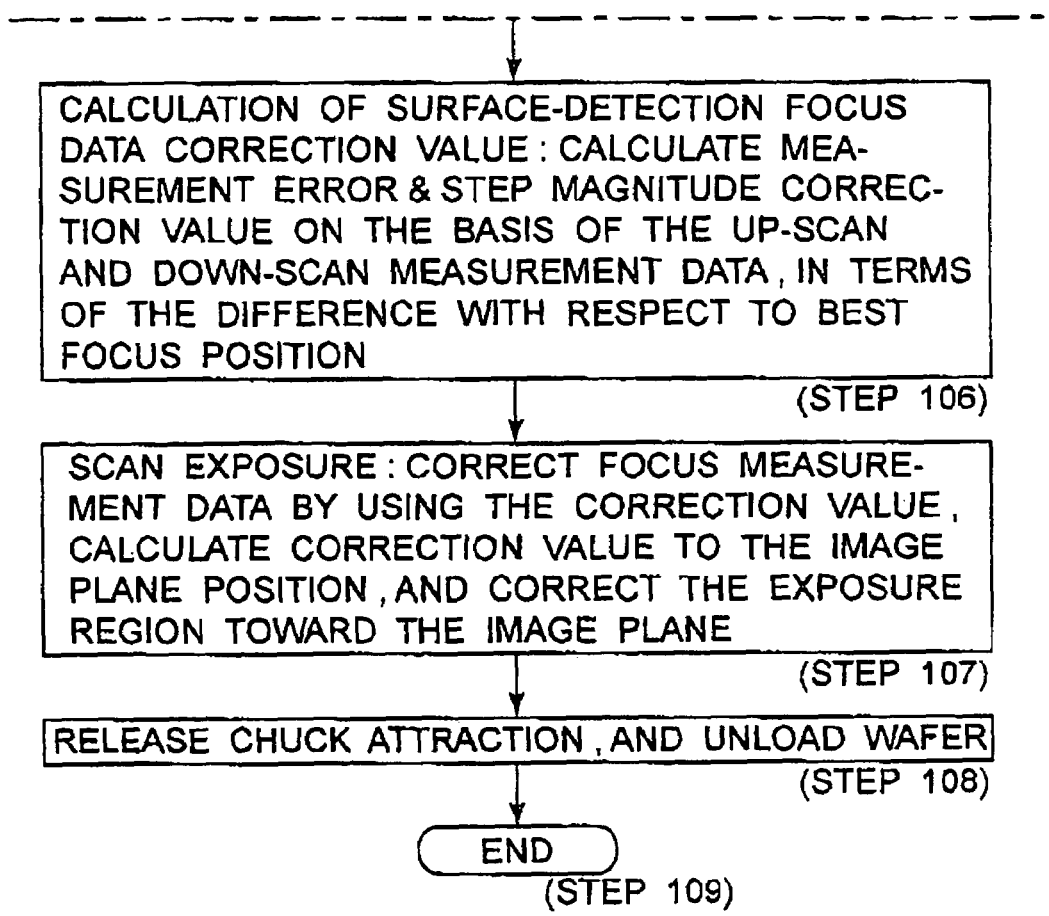

FIG. 7, including FIGS. 7A and 7B, shows an example of a correction sequence according to the present invention. At step 101, a start command is received. At step 102, a wafer is loaded on a wafer stage, and it is attracted to and held by a chuck. Subsequently, for measurement of the surface shape (plural surface positions) inside a process region (shot region) of the wafer to be exposed, with regard to six sample shot regions, such as depicted by hatching in FIG. 3, for example, pre-scan measurement is carried out with respect to each shot region, and the results are stored into a memory. Namely, at step 103, pre-scan measurement in the up direction is carried out and, at step 104, pre-scan measurement in the down direction is carried out in the same region as in the up-direction scan at step 103. The operation at step 103 and step 104 is carried out repeatedly to all the sample shot regions (six sample shot regions in this example) through step 105. In each sample shot region, the pre-scan measurement may be made plural times with respect to each direction.

Subsequently, at step 106, offset correction values to the best image plane position are calculated as follows. In the apparatus of FIG. 1, in order to obtain offset values for correcting errors in focus measured values attributable to the difference in surface state at the respective detection points, the surface position detection values (surface position data) stored in the memory at step 103 and step 104 are used. While taking, as a reference, the level of such a portion of the process region of the wafer where a highest focus precision is required, correction values (errors depending on the pattern structure) for correcting the surface position data during the scan exposure to the distance to the best exposure image plane position, are calculated.

Figure 6:
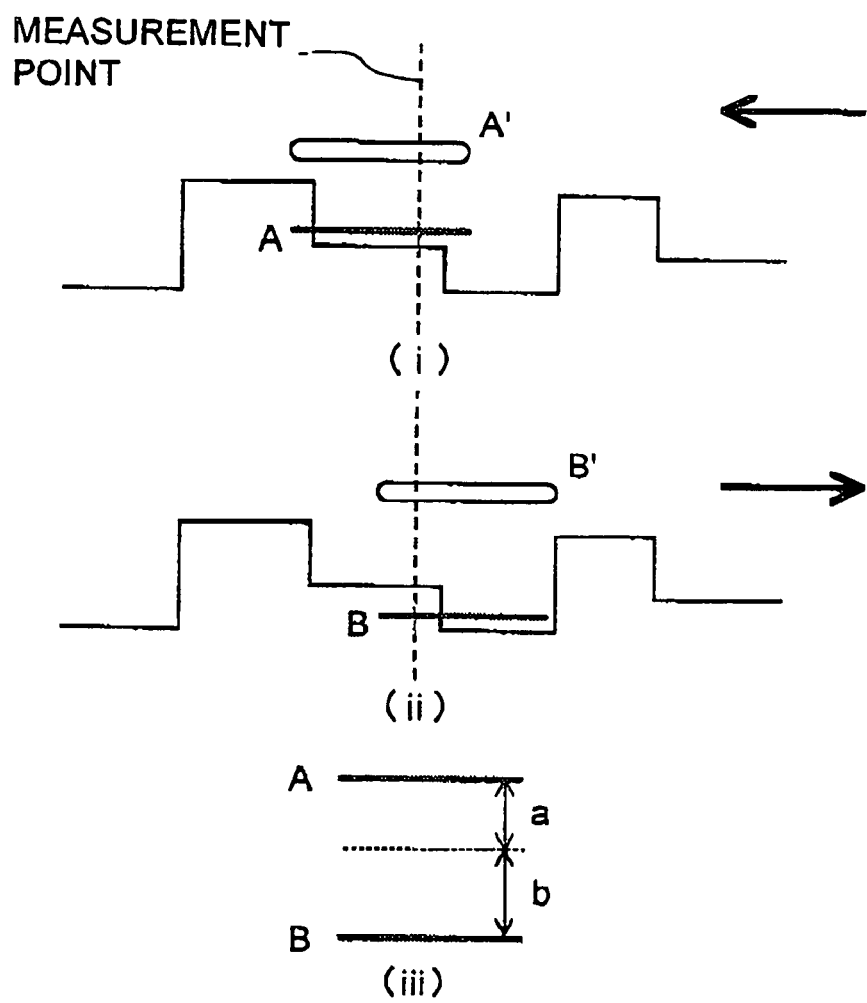
FIG. 6 is a schematic view for explaining the positional relationship of focus reference points in different scan directions, in accordance with a surface position detecting method of the present invention.

FIG. 6 illustrates the relation in the case when, when up- and down-direction scan measurements are carried out, an up/down direction difference (measurement error) is produced at the measurement point to be taken as a reference, due to the influence of jitter.

A portion (i) in FIG. 6 corresponds to the up-direction scan, and a portion (ii) corresponds to the down-direction scan. Reference characters A' and B' depict focus measurement regions in respective scan directions, and reference characters A and B depict offset reference surfaces in respective scan directions as determined by the result of measurement corresponding to A' and B'. A portion (iii) in FIG. 6 illustrates a correction method for the up/down direction difference of the offset reference surface. For example, if the position in the Z-axis direction is higher at A than at B, a relation A−B=X (X is up/down direction difference) is taken, and when the offset control is carried out while distributing the up/down direction difference of the offset reference surface at the ratio of a:b (a, b>0), the corrected offset reference surface can be represented by the following equation:

$$A - \frac{a}{a+b}X = B + \frac{b}{a+b}X.$$

Through the offset control made to the up/down direction difference of the offset reference surface, while distributing the same at an arbitrary proportion, as described above, good focus correction is assured without causing an up/down direction difference in the focus correction toward the best image plane position. The offset control may be done while taking either of the offset reference surfaces A and B as a reference, and no up/down direction difference is produced on that occasion.

When the calculation of offset correction value is completed, at step 107, during the scan exposure, the surface position detected values at the detection points for detecting the respective surface positions are corrected by use of the aforementioned offset correction value, which may be $$-\frac{a}{a+b}X \text{ or } \frac{b}{a+b}X$$

in accordance with the up/down direction, corresponding to the pattern structure at the detection point. On the basis of the corrected surface position detected values, the process region of the wafer to be exposed is registered with the exposure image plane, and then the exposure is carried out. Then, chuck attraction is released and the wafer is unlocked (step 108), and thereafter, the procedure is ended (step 109).

The offset correction value obtained through the pre-scan measurement at steps 103-106 depends on the pattern structure (actual surface step level difference in the process region, material of the substrate, and the like), and the scan speed. For those wafers in the same lot or having been processed through the same procedure, the pattern structure and the scan speed can be regarded as being the same. Therefore, offset correction values obtained with regard to at least the first one wafer in the lot may be applied to the remaining wafers.

The embodiment described above is merely an example. In the pre-scan measurement at steps 103-106, in the plural sample shot regions, as depicted by hatching in FIG. 3, up-direction scan may be made first to all the sample shot regions and, subsequently, down-direction scan may be made to all the sample shot regions. The number of the sample shots is not limited to six, and any number may be used. Further, while in this embodiment the surface position detection is carried out with respect to each simple shot, it may be done with respect to every plural shots.

Second Embodiment

In the above-described method, when the up/down offset correction values are compared between shots, and if there is a local eccentricity found in the up/down correction values, regarding such a point or such a shot, it may be considered that there is an influence of a defect in the wafer flatness due to a process factor or a chuck factor. In such a case, the data related to such a point or shot may be excluded from calculation of the offset correction value, and this is effective to increase the precision of the offset correction value.

Figure 8:
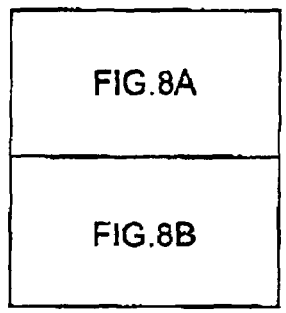
FIG. 8, including
Figure 8A:
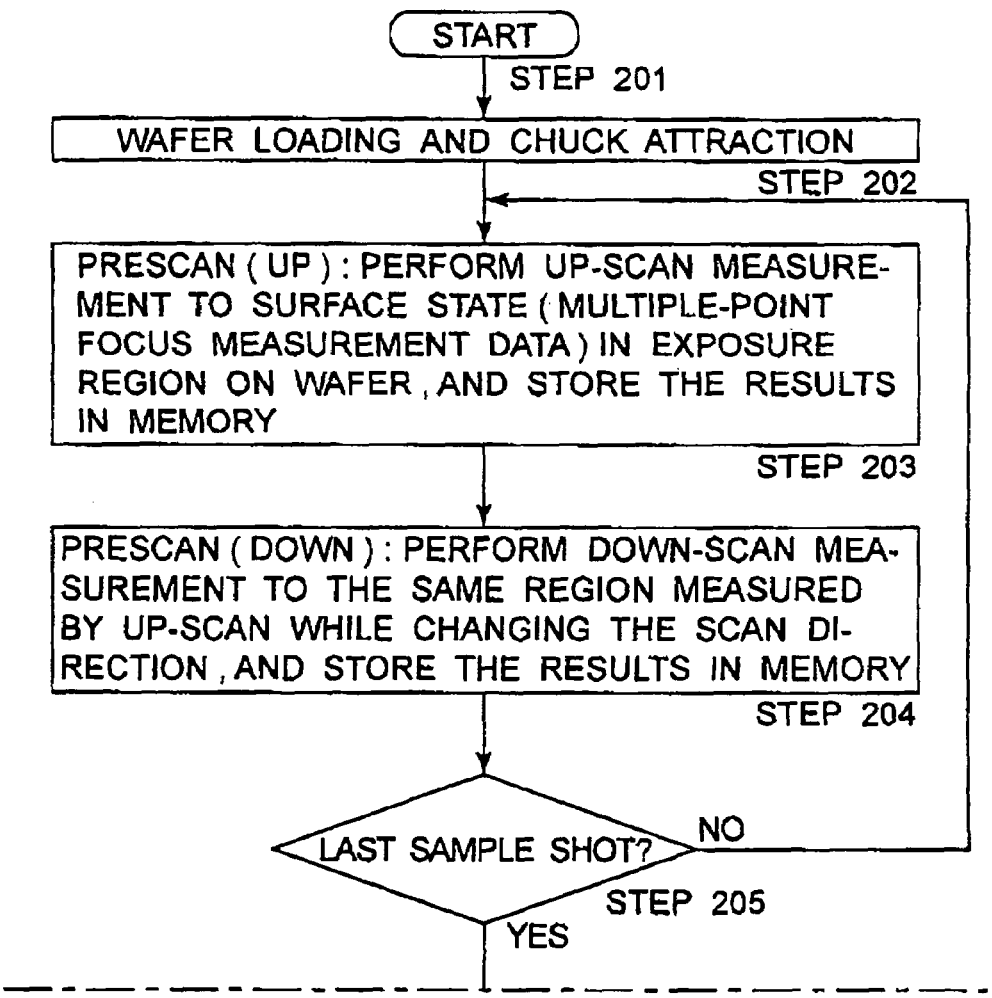
FIGS. 8A and 8B, is a flow chart for explaining an example of a sequence for surface position correcting drive during exposure, when there is a fault in the wafer flatness in the alternate scan.
Figure 8B:
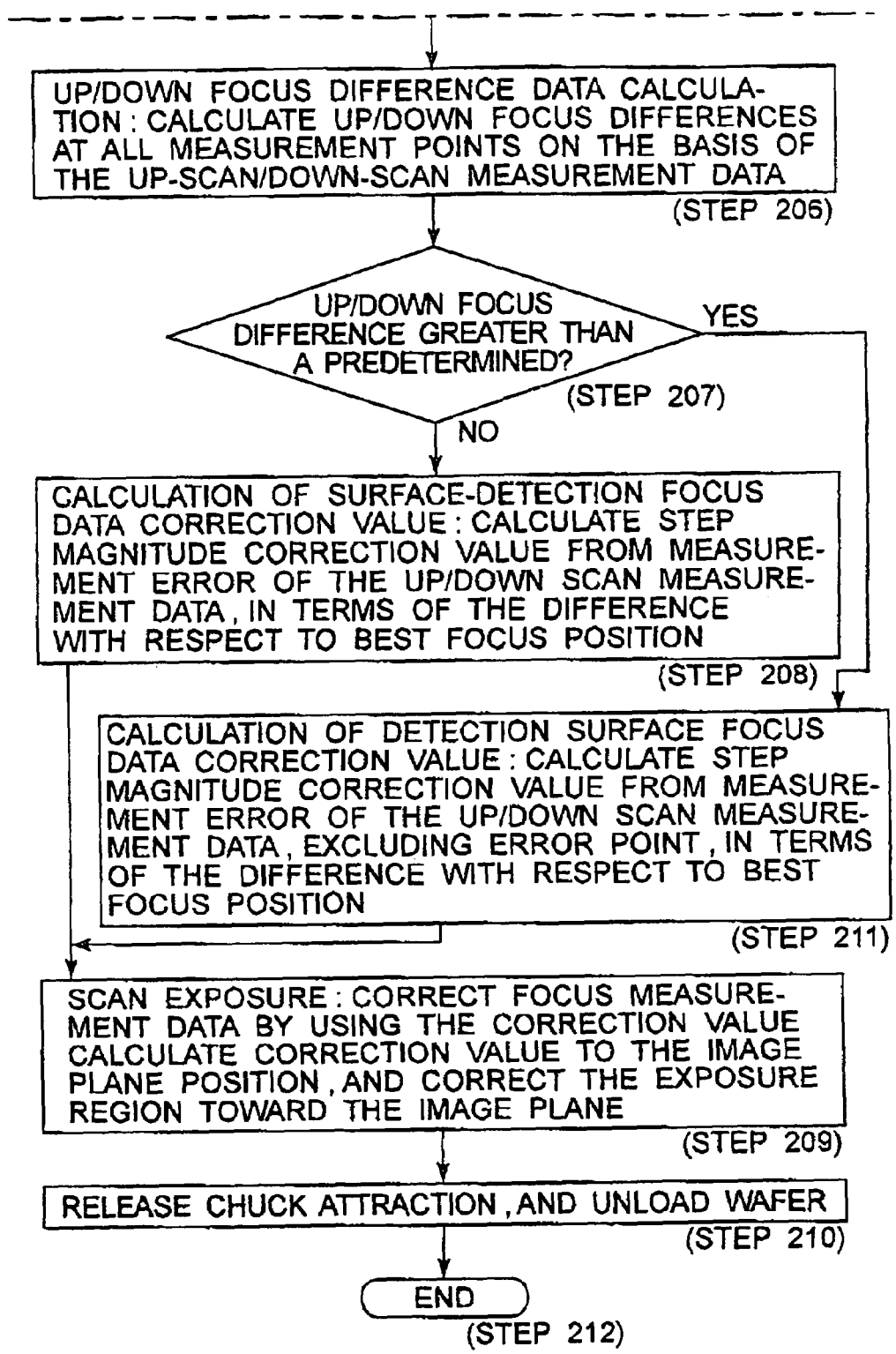

Such an embodiment will be described with reference to the flow chart of FIG. 8, which includes FIGS. 8A and 8B. In FIG. 8, a start command is received at step 201. At step 202, a wafer is loaded on a wafer stage, and it is attracted to and held by a chuck. Subsequently, for measurement of the surface shape (plural surface positions) inside a chip region or process region (shot region) of the wafer to be exposed, with regard to plural sample shot regions, such as depicted by hatching in FIG. 3, for example, pre-scan measurement is carried out with respect to each shot region, and the results are stored into a memory. Namely, at step 203, pre-scan measurement in the up direction is carried out and, at step 204, pre-scan measurement in the down direction is carried out in the same region as in the up-direction scan at step 203. The operation at step 203 and step 204 is carried out repeatedly to all the sample shot regions (six sample shot regions, in this example).

Thereafter, at step 205, a discrimination is made as to whether the shot is the last sample shot or not. If it is the last sample shot (YES), at step 206 the up/down direction difference is calculated on the basis of the surface position detected values (surface position data) as measured by the up/down scans and memorized into the memory. Also, if, as a result of a discrimination at step 205, the shot is not the last sample shot, the sequence goes back to step 203.

At step 207, when any of the up/down direction difference is less than a predetermined amount (NO), the sequence goes to step 208, at which the offset correction values toward the best image plane position are calculated in accordance with the calculation method in the first embodiment. Here, the predetermined amount may be determined on the basis of an average value obtainable from all the sample shots and/or reticle design, for example.

If, at step 207, any of the up/down direction differences is larger than the predetermined amount (YES), it is concluded that this is because of a defect, or the like, of the wafer flatness due to process factor or chuck factor, and the sequence goes to step 211. At step 211, offset correction values toward the optimum image plane position are calculated in accordance with the calculation method of the first embodiment, and on the basis of the up/down scan measurement data with the data concerning the error point in question being excluded. When the correction value calculation is completed at step 208 or step 211, exposure is carried out at step 209, while at step 209, during the scan exposure, the surface position detected values at the detection points for the surface position detection are corrected by the correction values corresponding to the pattern structure, for example, at the detection point, and additionally, the process region to be exposed is registered with the exposure image plane on the basis of the thus corrected surface position detected values. After this, at step 216, the chuck attraction is released, and the wafer is unloaded. Following that, the procedure is finished in step 212.

In accordance with the first and second embodiments described hereinbefore, even if there is a positional deviation (jitter) at the measurement point as produced in accordance with the scan direction, since a scan direction difference of a measured value is taken into account during the calculation process of the offset amounts, the surface position measured values influenced by the surface irregularities of the process region (shot) can be well corrected at high precision.

Thus, in slit-scan type exposure apparatuses, by performing offset correction to the surface position measured values as described, each process region (shot) of the wafer can be exactly positioned within the DOF (depth of focus) of the reduction projection lens 1. Therefore, good pattern transfer is assured, and large-scale integrated circuits can be produced stably.

As regards the point or shot with respect to which the up/down direction difference of the surface position detected values is larger than a predetermined amount, since it may be a result of influence of a defect, or the like, of the wafer flatness due to a process factor, for example, the detected value in question may be excluded from the calculation of the offset correction value. This effectively improves the precision of the offset correction value.

Embodiment of Device Manufacturing Method

Next, an embodiment of a device manufacturing method, which uses an exposure apparatus described above, for the production of microdevices, such as semiconductor devices, will be explained.

Figure 9:
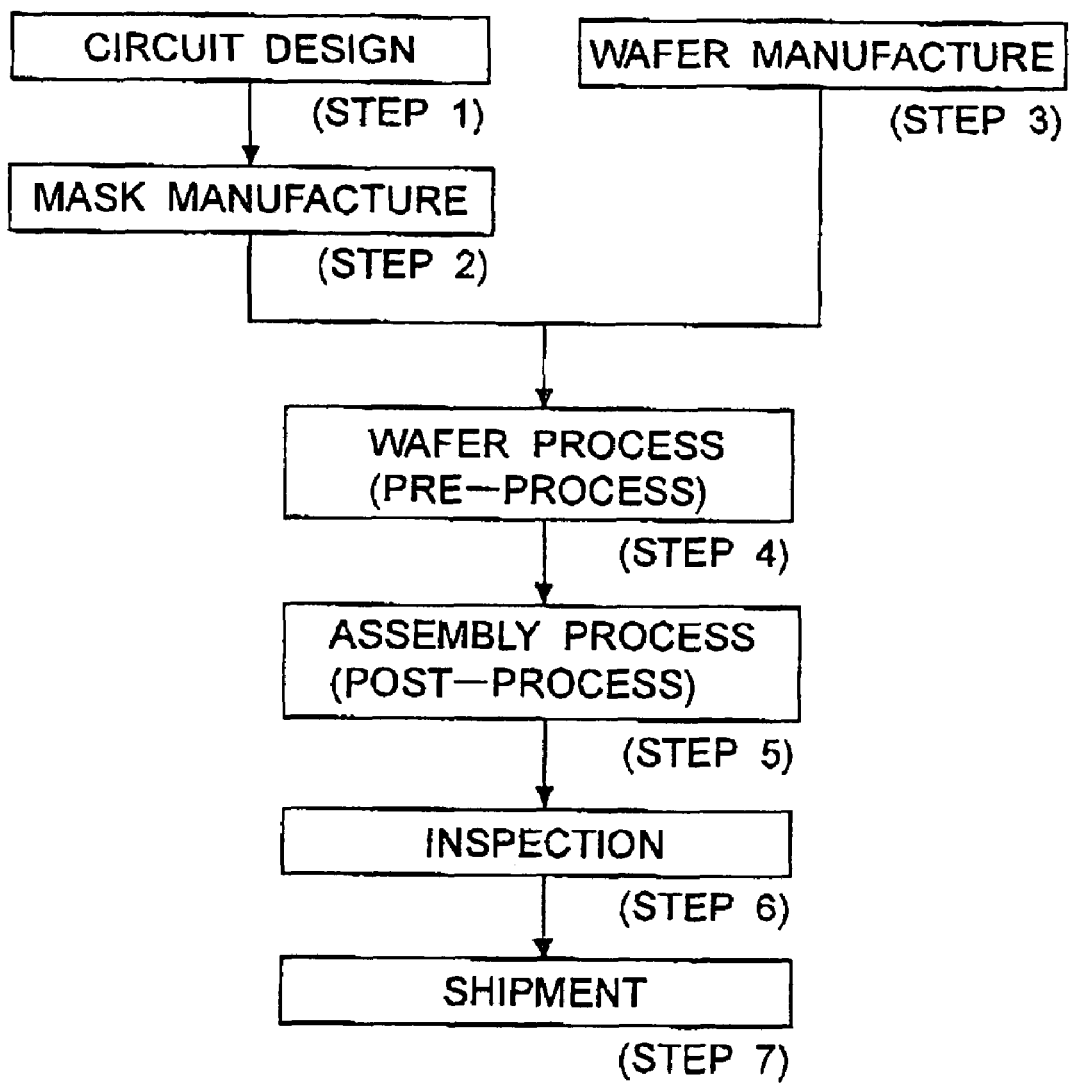
FIG. 9 is a flow chart for explaining a semiconductor device manufacturing procedure.

FIG. 9 is a flow chart for explaining the procedure of manufacturing various microdevices, such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembling step, which is called a post-process, wherein the wafer having been processed at step 4 is formed into semiconductor chips. This step includes an assembling (dicing and bonding) process and a packaging (chip sealing) process. Step 6 is an inspection step, wherein an operation check, a durability check and so on, for the semiconductor devices produced by step 5, are carried out. With these processes, semiconductor devices are produced, and they are shipped (step 7).

Figure 10:
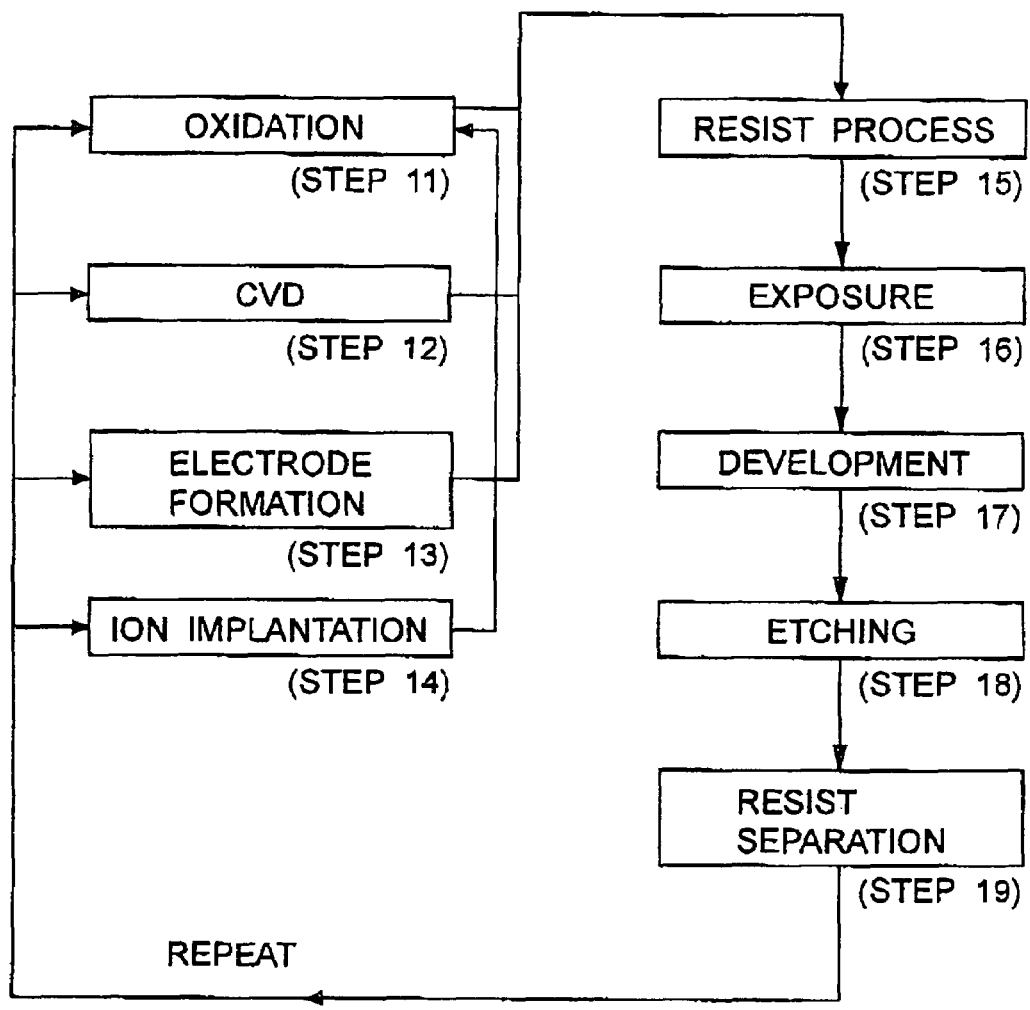
FIG. 10 is a flow chart for explaining details of a wafer process in the procedure shown in FIG. 9.

FIG. 10 is a flow chart for explaining details of the wafer process at step 4 in FIG. 9. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the present invention, as described above, improved surface position detecting technology, by which a position of a surface of an object can be detected very precisely, is provided.

While the invention has been described with reference to the structures disclosed herein, it is not confined to the details set forth and this application is intended to cover such modifications or changes as may come within the purposes of the improvements or the scope of the following claims.

What is claimed is:

1. A measuring apparatus for measuring a position of a surface of an object while the object is scanned in a scanning direction in an X-Y plane, said apparatus comprising:
   a detecting unit configured to detect the position of the surface of the object in a Z direction perpendicular to the X-Y plane;
   a stage configured to scan the object relative to said detecting unit in the scanning direction; and
   a controller configured to cause said stage to scan the object relative to said detecting unit in two scanning directions, in the X-Y plane, opposite to each other, to detect, using said detecting unit, with respect to each of the two scanning directions, a position of the surface in the Z direction for the same detection point on the surface, to calculate a correction value for correcting a position of the surface to be detected by said detecting unit while the object is scanned relative to said detecting unit in one of the two scanning directions, based on the positions of the surface detected for the same detection point with respect to the two scanning directions, and to correct the position of the surface detected by said detecting unit while the object is scanned relative to said detecting unit in the one of the two scanning directions, with the calculated correction value.

2. A measuring apparatus according to claim 1, wherein the object is a semiconductor wafer.

3. A measuring apparatus according to claim 1, wherein said controller is configured to cause said detecting unit to detect the position of the surface with respect to each of a plurality of sample shot regions on the surface.

4. A measuring apparatus according to claim 1, wherein said controller is configured to weighted-average the positions of the surface detected for the same point with respect to the two scanning directions, and to calculate the correction value based on the weighted average.

5. A measuring apparatus according to claim 3, wherein said controller is configured to choose data of the position of the surface to be used for calculation of the correction value, based on a difference between the positions of the surface detected for the same position with respect to the two scanning directions.

* * * * *